United States Patent
Cherbis et al.

(10) Patent No.: US 9,661,755 B2
(45) Date of Patent: May 23, 2017

(54) SYSTEM AND A METHOD FOR SOLDER MASK INSPECTION

(75) Inventors: Yosi Cherbis, Haifa (IL); Noam Rozenshtein, Afula (IL); Tomer Segev, Shimshit (IL); Avi Levy, Mitzpe Aviv (IL)

(73) Assignee: CAMTEK LTD., Migdal Haemeq (IL)

( * ) Notice: Subject to any disclaimer, the term of this patent is extended or adjusted under 35 U.S.C. 154(b) by 916 days.

(21) Appl. No.: 13/545,014

(22) Filed: Jul. 10, 2012

(65) Prior Publication Data

US 2013/0177698 A1 Jul. 11, 2013

Related U.S. Application Data

(63) Continuation-in-part of application No. 13/391,834, filed on Jun. 11, 2012.

(60) Provisional application No. 61/512,477, filed on Jul. 28, 2011.

(51) Int. Cl.
| | |
|---|---|
| *H05K 3/22* | (2006.01) |
| *H05K 3/12* | (2006.01) |
| *H05K 3/34* | (2006.01) |
| *H05K 13/08* | (2006.01) |

(52) U.S. Cl.
CPC .......... *H05K 3/22* (2013.01); *H05K 3/1233* (2013.01); *H05K 3/225* (2013.01); *H05K 3/3484* (2013.01); *H05K 13/08* (2013.01); *H05K 2203/163* (2013.01)

(58) Field of Classification Search
CPC .. H05K 3/22; H05K 3/1233; H05K 2203/163; H05K 3/3484; H05K 13/08; H05K 3/225

USPC ........................................................ 427/96.1
See application file for complete search history.

(56) References Cited

U.S. PATENT DOCUMENTS

| | | | |
|---|---|---|---|
| 5,621,811 | A | 4/1997 | Roder et al. |
| 5,809,642 | A | 9/1998 | Ishihara et al. |
| 5,912,984 | A | 6/1999 | Michael et al. |
| 6,342,266 | B1 | 1/2002 | Forstén |
| 6,754,551 | B1 * | 6/2004 | Zohar ................ B41J 2/01 |
| | | | 228/43 |
| 7,013,802 | B2 | 3/2006 | Marszalkowski, Jr. |
| 7,185,799 | B2 | 3/2007 | Pearson et al. |
| 7,349,575 | B2 | 3/2008 | Hattori et al. |
| 7,611,216 | B2 | 11/2009 | Sussmeier |
| 2002/0019680 | A1 | 2/2002 | Nishikawa et al. |
| 2003/0001117 | A1 | 1/2003 | Hyun |
| 2006/0105495 | A1 | 5/2006 | Dutheil |
| 2010/0074515 | A1 | 3/2010 | Zhao et al. |

FOREIGN PATENT DOCUMENTS

| | | |
|---|---|---|
| CN | 102033073 | 4/2011 |
| JP | 2005199628 | 7/2005 |
| WO | WO0163988 | 8/2001 |

* cited by examiner

*Primary Examiner* — William Phillip Fletcher, III
(74) *Attorney, Agent, or Firm* — Reches Patents

(57) ABSTRACT

A system and a method for inspection aided printing, the method may include printing, by a printing unit of a system, a pattern on an area of a substrate, during a printing process; inspecting, by an inspection unit of the system, the area to provide inspection results; searching, by a processor of the system, for a defect, based upon the inspection results; and wherein if a defect is found—determining whether to (a) repair the substrate, (b) perform a corrective measure for improving the printing process, or (c) perform no corrective measure in response to the defect.

14 Claims, 10 Drawing Sheets

SYSTEM AND A METHOD FOR SOLDER MASK INSPECTION

RELATED APPLICATIONS

This application claims priority from provisional paten filing date Jul. 28, 2011, Ser. No. 61/512,477. This application is a continuation in part of U.S. patent application Ser. No. 13/391,834, filing date Feb. 23, 2012 which is a national phase of PCT patent application PCT/IL10/00539 which claims priority of U.S. provisional patent application Ser. No. 61/223,074, filing date 6 Jul. 2009, all applications are incorporated herein by reference.

BACKGROUND OF THE INVENTION

One or more Printed Circuit Boards (PCBs) may be included in a single panel. Prior art PCB production systems have dedicated Automatic Optical Inspection (AOI) systems that are separated from printing systems. The prior art PCB manufacturing process may include: (i) inspection of a PCB by an AOI system (ii) PCB cleaning and surface preparation; (iii) solder mask coating by a dedicated printing machine (which can either be done by silk screen printing (photo image able or not), curtain coating or spray coating (photo image able)), (iv) Tack free curing; (v) UV exposure; (vi) solder mask development; (vii) solder mask inspection (by a dedicated system); and (viii) final curing.

This process requires many panel handling form various different systems such as the AOIs, cleaning equipment, solder mask deposition equipment etc., thus increasing significantly handling related defects which reduce the production line yield.

SUMMARY OF THE INVENTION

There may be provided a system and a method as illustrated in the specification and the claims.

There may be provided a method for inspection aided printing, the method may include printing, by a printing unit of a system, a pattern on an area of a substrate, during a printing process; inspecting, by an inspection unit of the system, the area to provide inspection results; searching, by a processor of the system, for a defect, based upon the inspection results; and wherein if a defect is found—determining whether to (a) repair the substrate, (b) perform a corrective measure for improving the printing process, or (c) perform no corrective measure in response to the defect.

There may be provided a system that may include a printing unit, arranged to print a pattern on an area of a substrate, during a printing process; an inspection unit, arranged to inspect the area of the substrate to provide inspection results; and a processor, arranged to search for a defect, based upon the inspection results; and to determine, if a defect is found whether to (a) repair the substrate, (b) perform a corrective measure for improving the printing process, or (c) perform no corrective measure in response to the defect.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

FIGS. 6, 8 and 10 illustrate methods according to various embodiments of the invention.

DETAILED DESCRIPTION OF THE DRAWINGS

Figure 1:
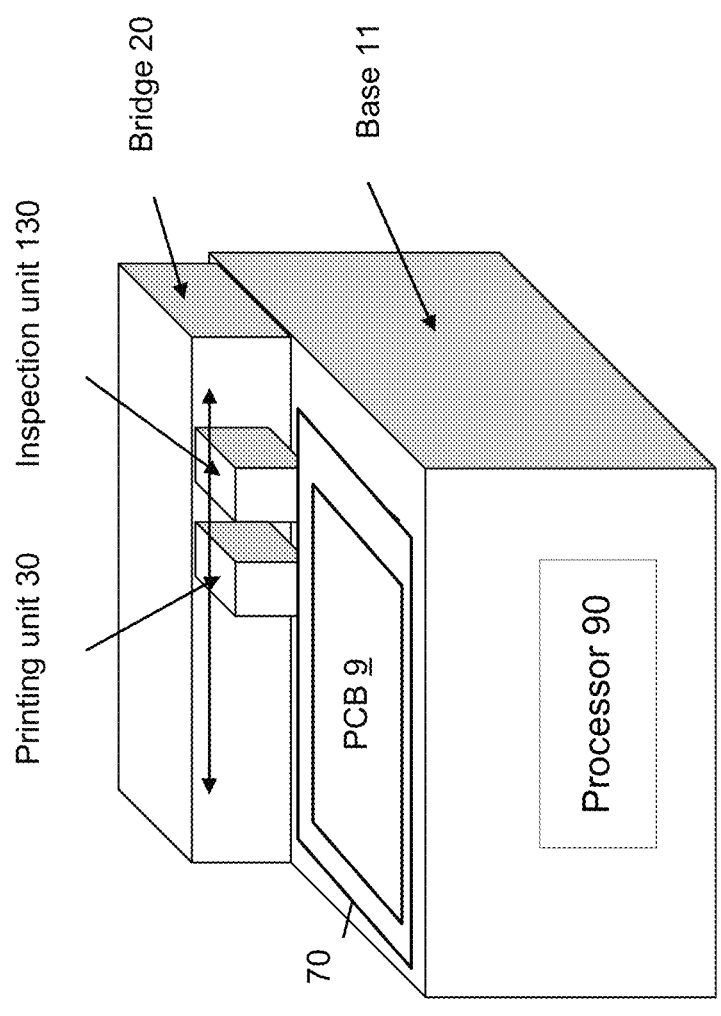
FIGS. 1, 5 and 10 illustrate a system according to various embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A method may be provided. According to an embodiment of the invention the method may include: acquiring images of multiple areas of a PCB by an inspection unit while the PCB is supported by a mechanical stage; determining spatial differences between a model of the PCB and the PCB based on the images; determining solder mask ink deposition locations based on (i) the spatial differences, and (ii) locations of the model of the PCB that should be coated with the solder mask ink; and printing solder mask ink on the solder mask deposition locations by a printing unit, while the PCB is supported by the mechanical stage.

The method may include determining whether the PCB or part of the PCB is of at least a desired quality, based on at least some of the images; and printing solder mask ink only if the PCB is of at least the desired quality.

The method may include inspecting the PCB after a completion of the printing of the solder mask ink to detect missing solder mask ink locations that should have been coated by solder mask ink but are not coated by solder mask ink, while the PCB is supported by the mechanical stage; and printing solder mask ink on at the missing solder mask ink locations while the PCB is supported by the mechanical stage.

The method may include inspecting the actual PCB after depositing solder mask ink at a plurality of solder mask ink deposition locations to detect missing solder mask ink locations that should have been coated by solder mask ink but are not coated by solder mask ink, while the PCB is supported by the mechanical stage; and printing solder mask ink on at the missing solder mask ink locations while the PCB is supported by the mechanical stage.

The method may include inspecting the PCB after depositing solder mask ink at a plurality of solder mask deposition locations to detect excess solder mask ink; and removing the excess solder mask ink by a repair unit.

The method may include inspecting the PCB after depositing solder mask ink at a plurality of solder mask deposition locations to detect contaminations in the solder mask area and removing the contaminations by a repair unit while. The removal may be executed while the PCB is supported by a mechanical stage.

The method may include: acquiring images of multiple areas of the PCB by an inspection unit while introducing movement between the inspection unit and a bridge that is located above the mechanical stage; and printing solder mask ink on the solder mask deposition locations by the printing unit while introducing movement between the printing unit and the bridge.

The method may include: acquiring images of multiple areas of the PCB by an inspection unit while introducing movement between the inspection unit and a first bridge that is located above the mechanical stage; and printing solder mask ink on the solder mask deposition locations by the printing unit while introducing movement between the printing unit a second bridge.

The method may include: acquiring images of multiple areas of the PCB by an inspection unit while moving the mechanical stage along a first direction and moving the inspection unit along a second direction; and printing solder mask ink on the solder mask deposition locations while moving the mechanical stage along a first direction and moving the printing unit along a second direction.

The method may include curing the solder mask ink by the printing unit.

The determining of the spatial differences may include performing global alignment and local alignment.

A system for solder mask printing on a printed circuit board (PCB) is provided. According to an embodiment of the invention the system may include: a mechanical stage for supporting the PCB; an inspection unit for acquiring images of multiple areas of a PCB while the PCB is supported by the mechanical stage; a processor for determining spatial differences between a model of the PCB and the PCB based on the images and for determining solder mask ink deposition locations based on (i) the spatial differences, and (ii) locations of the model of the PCB that should be coated with the solder mask ink; and a printing unit for printing solder mask ink on the solder mask deposition locations, while the PCB is supported by the mechanical stage.

The processor may be configured to determine whether the PCB is of at least a desired quality, based on at least some of the images and wherein the printing unit may be arranged to print solder mask ink only if the PCB is of at least the desired quality.

The inspection unit may be arranged to inspect the PCB after a completion of the printing of the solder mask ink to detect missing solder mask ink locations that should have been coated by solder mask ink but are not coated by solder mask ink, while the PCB is supported by the mechanical stage; and wherein the printing unit may be arranged to print solder mask ink on at the missing solder mask ink locations while the PCB is supported by the mechanical stage.

The inspection unit may be arranged to inspect the actual PCB after depositing solder mask ink at a plurality of solder mask ink deposition locations to detect missing solder mask ink locations that should have been coated by solder mask ink but are not coated by solder mask ink, while the PCB is supported by the mechanical stage; and wherein the printing unit may be arranged to print solder mask ink on at the missing solder mask ink locations while the PCB is supported by the mechanical stage.

The inspection unit may be arranged to inspect the PCB after depositing solder mask ink at a plurality of solder mask deposition locations to detect excess solder mask ink; and wherein the system further comprises a repair unit for removing the excess solder mask ink while the PCB is supported by the mechanical stage.

The model of the PCB may be a computer aided design model of the PCB.

The inspection unit may be arranged to acquire images of multiple areas of the PCB by an inspection unit while introducing movement between the inspection unit and a bridge that is located above the mechanical stage; and wherein the printing unit may be arranged to print solder mask ink on the solder mask deposition locations by the printing unit while introducing movement between the printing unit and the bridge.

The inspection unit may be arranged to acquire images of multiple areas of the PCB by an inspection unit while introducing movement between the inspection unit and a first bridge that is located above the mechanical stage; and wherein the printing unit may be arranged to print solder mask ink on the solder mask deposition locations by the printing unit while introducing movement between the printing unit a second bridge.

The inspection unit may be arranged to acquire images of multiple areas of the PCB by an inspection unit while moving the mechanical stage along a first direction and moving the inspection unit along a second direction; and wherein the printing unit may be arranged to printing solder mask ink on the solder mask deposition locations while moving the mechanical stage along a first direction and moving the printing unit along a second direction.

The printing unit may be arranged to cure the solder mask ink by the printing unit.

The processor may be arranged to determine the spatial differences comprising performing global alignment and local alignment.

The systems and methods herein disclosed include a digital printing of the solder mask ink—wherein the solder mask ink is applied only where it is required on the PCB. This facilitates an inspection of the solder mask printing quality immediately after the solder mask ink deposition process.

According to an embodiment of the invention, the system includes a sensor such as but not limited to a line sensor (other sensors such as area sensors can be used) for capturing the panel and solder mask ink location. With the herein disclosed systems and methods, the panel is inspected either prior to the printing phase for panel approval before solder mask ink deposition or right after the printing process at a stage where the panel can still be fixed.

According to an embodiment of the invention, the system is capable of inspecting the PCB prior to the solder mask deposition, to verify that there are no defects in its outer layers, print the solder mask on the PCB, and inspect the solder mask deposition to verify good coverage and accurate deposition.

Conveniently, various stages of the printing process can be executed by the same system, while the PCB is supported by the same mechanical stage. This may allow a provision of a printing process and system that is characterized by in line and real time (or almost real time) feedback, a faster cycle time, a reduction of reducing handling related defect, a reduction in yield losses, and reduction in printing process time and cost.

According to an embodiment of the invention, a system is disclosed, that is conveniently a solder mask direct digital material deposition system, which enables a digital deposition of the required "coating" on PCBs in order to protect the metallic wiring on the surface which is not the metallic pads.

According to an embodiment of the invention, Computer Aided Design (CAD) data may be used, e.g. for adjusting the drop deposition location according to the grabbed panel image. Thus, the disclosed systems and methods may facilitate high accuracy, production flexibility and environmental friendly and cleanly process without wasting problematic chemicals.

According to an embodiment of the invention, currently available golden board data may be used, e.g. for adjusting the drop deposition location according to the grabbed panel image. Thus, the disclosed systems and methods may facilitate high accuracy, production flexibility and environmental friendly and cleanly process without wasting problematic chemicals.

According to an aspect of the invention, disclosed systems and methods include combined printing of solder mask and inspecting the printed product (not necessarily the solder mask).

FIG. 1 illustrates a system 10, according to an embodiment of the invention.

System 10 includes a base 11 that may include mechanical and electrical components.

FIG. 1 illustrates system 10 as including bridge 20, inspection unit 130, printing unit 30 and an object handling sub-system 70.

The object handling sub-system 70 support a PCB 9 (or a multiple PCB panel). An example of various components included in base 11 is provided in FIG. 5.

Figure 2:
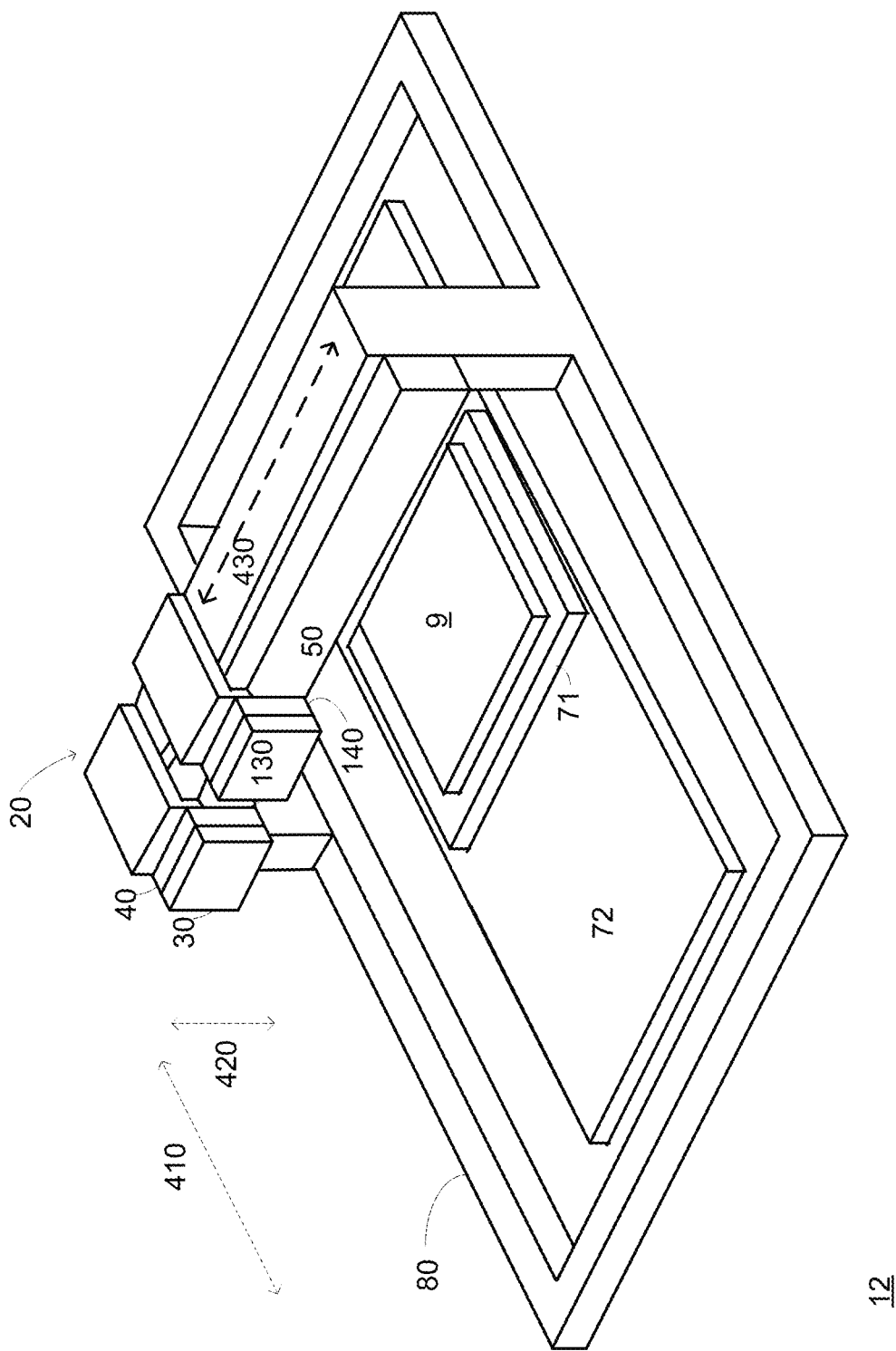
FIGS. 2, 3, 4, 7 and 9 illustrate portions of a system according to various embodiments of the invention.

FIG. 2 illustrates a first portion 200 of system 10 according to an embodiment of the invention.

First portion 200 includes bridge 20, frame 80, printing unit 30, inspection unit 130, first motor 40, bridge motor 50, second motor 140 and PCB handling sub-system 70.

The multiple motors facilitate movements along various directions. For simplicity of explanation various structural elements connected to the motors or in touch with the motors (such as rails, chains and the like) are not shown.

PCB handling sub-system (also referred to as mechanical stage) 70 includes an object supporter 71 that supports the PCB 9 and may firmly hold it after the PCB 9 is being aligned and positioned in a desired location and orientation. PCB handling sub-system 70 also includes a motorized system 72 that may move object supporter 71 (and PCB 9) along first direction 410 (for example—x-axis).

First motor 40 moves printing unit 30 along second direction 420 (for example—z-axis). Second motor 140 moves inspection unit 130 along the second direction 420. Bridge motor 50 moves printing unit 30 and, additionally or alternatively inspection unit 130 along a longitudinal axis 430 (for example—y-axis) of the bridge 20. A PCB 9 is placed on object supporter 71. It is noted that motorized system 72 can be held by (or be supported by) a part (not shown) of frame 80.

FIG. 2 illustrates first direction 410, second direction 420 and longitudinal axis 430 as being perpendicular to each other. It is noted that these directions (and axis) may be oriented to each other by less than (or more than) 90 degrees.

Bridge 20 is fixed to frame 80 and rigid. Frame 80 is located in a horizontal plane and has a rectangular shape. It is noted that frame 80 may have other shapes and may be oriented in relation to the horizon.

Bridge 20 provides a highly accurate and stable structure the does not move during the printed process and during the inspection process, and simplifies the control scheme of the imaging printing process. The fixed and rigid bridge 20 does not include extensive moving parts and its maintenance is simple and cheap. Bridge 20 includes a horizontal structural element (that defines its longitudinal axis 430) and two vertical structural elements that define a space in which PCB 9 may move.

Bridge 20 is configured to accommodate in a precise manner printing unit 30. Printing unit 30 may include jet nozzles for injecting a solder mask ink to form a solder mask on the surface of an object.

The jet nozzles of the printing unit 30 may be arranged in various manners. For example, jet nozzles (denoted 31 in FIG. 3) may be arranged in lines that are parallel to each other and are spaced apart from each other to form an array of jet nozzles.

Figure 3:
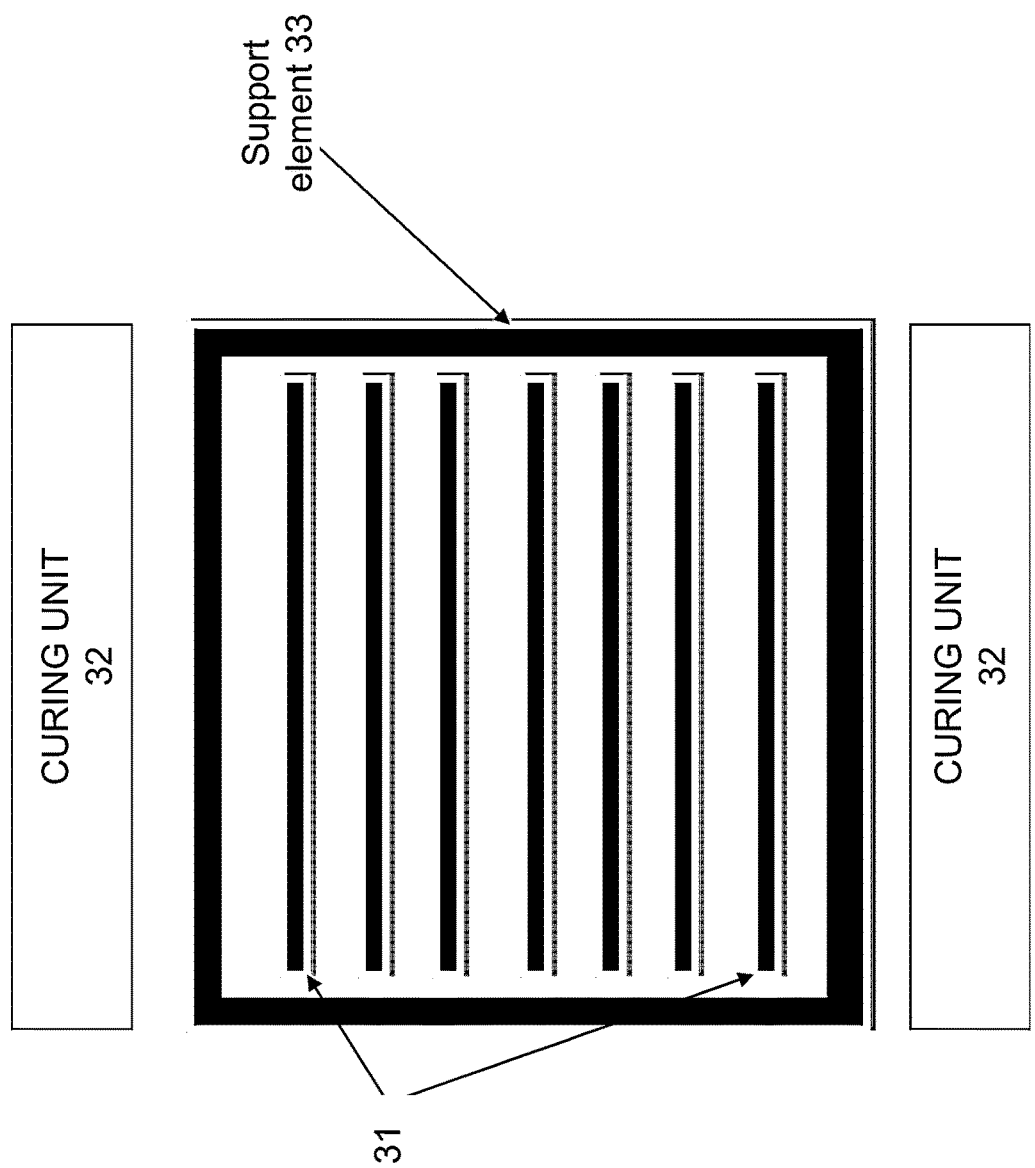

FIG. 3 also illustrates (i) supporting elements 33 that are connected between the jet nozzles 31 and the first motor 40 and (ii) a pair of curing units 32 that are located at both sides of the array of jet nozzles 31. These curing units 32 can use UV radiation, heat or any other radiation based curing techniques. The number of curing units 32 and their position may differ from those illustrated in FIG. 3. For example, one of more curing units can be separated from the printing unit and can, for example, be coupled to the bridge 20.

The array may have a rectangular shape as illustrated in FIG. 3, a diamond like shape, a rectangular shape, a circular shape and the like.

The printing unit 30 and the inspection unit 130 may be controlled independently from each other. Both units may be activated in parallel to each other. For example—if the object that is being processed is a multiple-PCB panel then the printing unit 30 can print solder mask patterns on one PCB of the panel while the inspection unit can image another PCB of the panel. The same applies to different areas of a PCB that is large enough to be included simultaneously in the field of view of both heads 30 and 130.

It is noted that the inspection head 130 and the printing head 30 may be located on opposing sides of the bridge 20 (one in front of bridge 20—as illustrated in FIG. 2 and the other unit at the rear side of the bridge 20)—each unit is connected to a different bridge motor. Yet for another example—the printing unit 30 and the inspection unit 130 may be positioned at different heights.

It is noted that the mentioned above inspection unit 130 may include illumination optics, one or more light sources, collection optics and one or more sensors such as a line sensor, an area sensor and the like.

Figure 4:
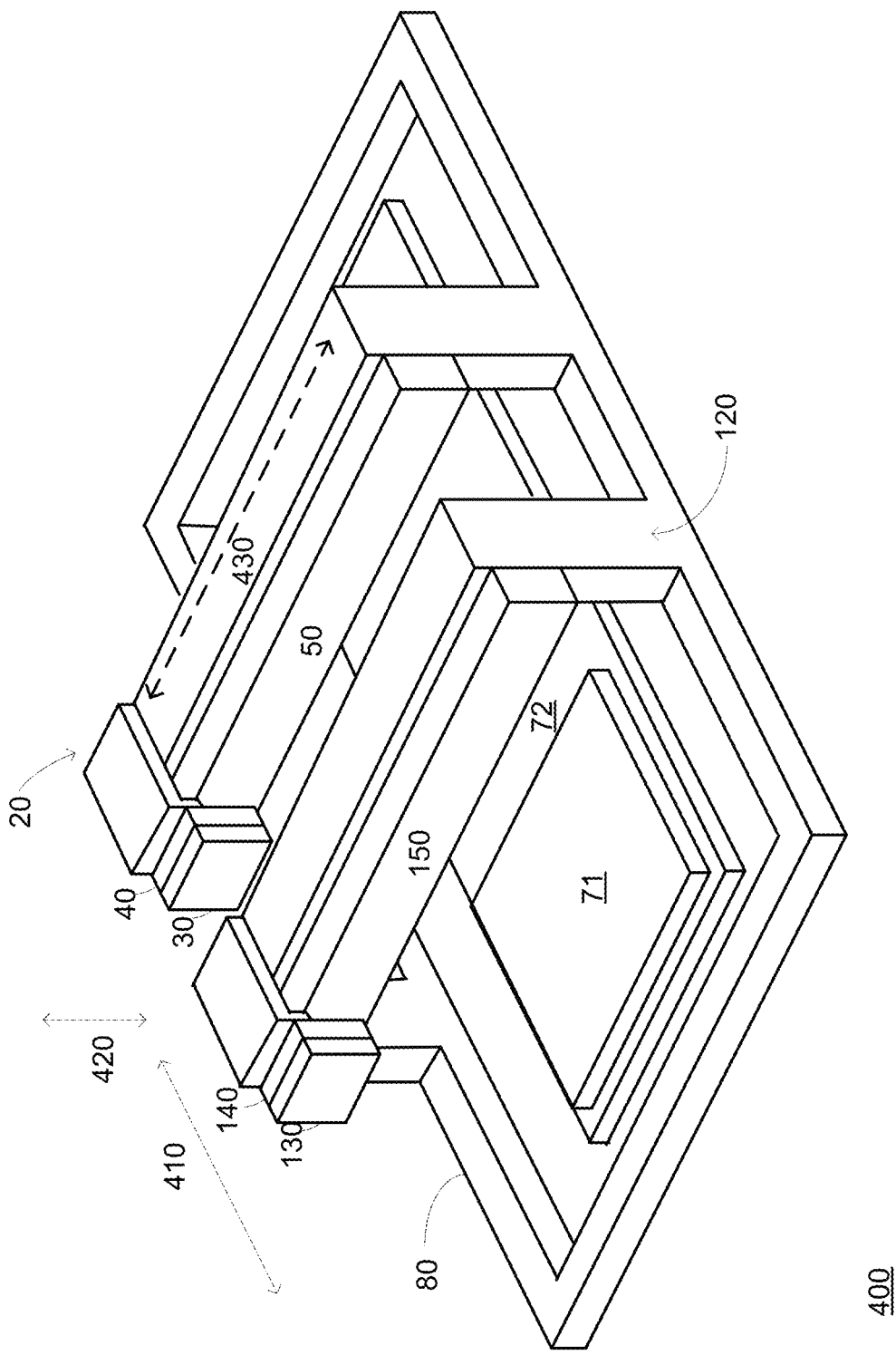

FIG. 4 illustrates a first portion 400 of system 10 according to an embodiment of the invention.

First portion 400 of FIG. 4 differs from first portion 200 of FIG. 2 by including two bridges (20 and 120) instead of a single bridge (20). The printing unit 30 is coupled (via motors 40 and 50 and/or additional structural elements such as rails) to the first bridge 20 while the inspection unit 130 is coupled (via motors 140 and 150 and/or additional structural elements such as rails) to the second bridge 120.

According to an embodiment of the invention a curing unit (not shown) can be included in the printing unit 30, coupled to one bridge (As illustrate din FIG. 7) or be located between bridges 20 and 120.

FIG. 4 illustrates two bridges 20 and 120 that are parallel to each other but this is not necessarily so.

Figure 5:
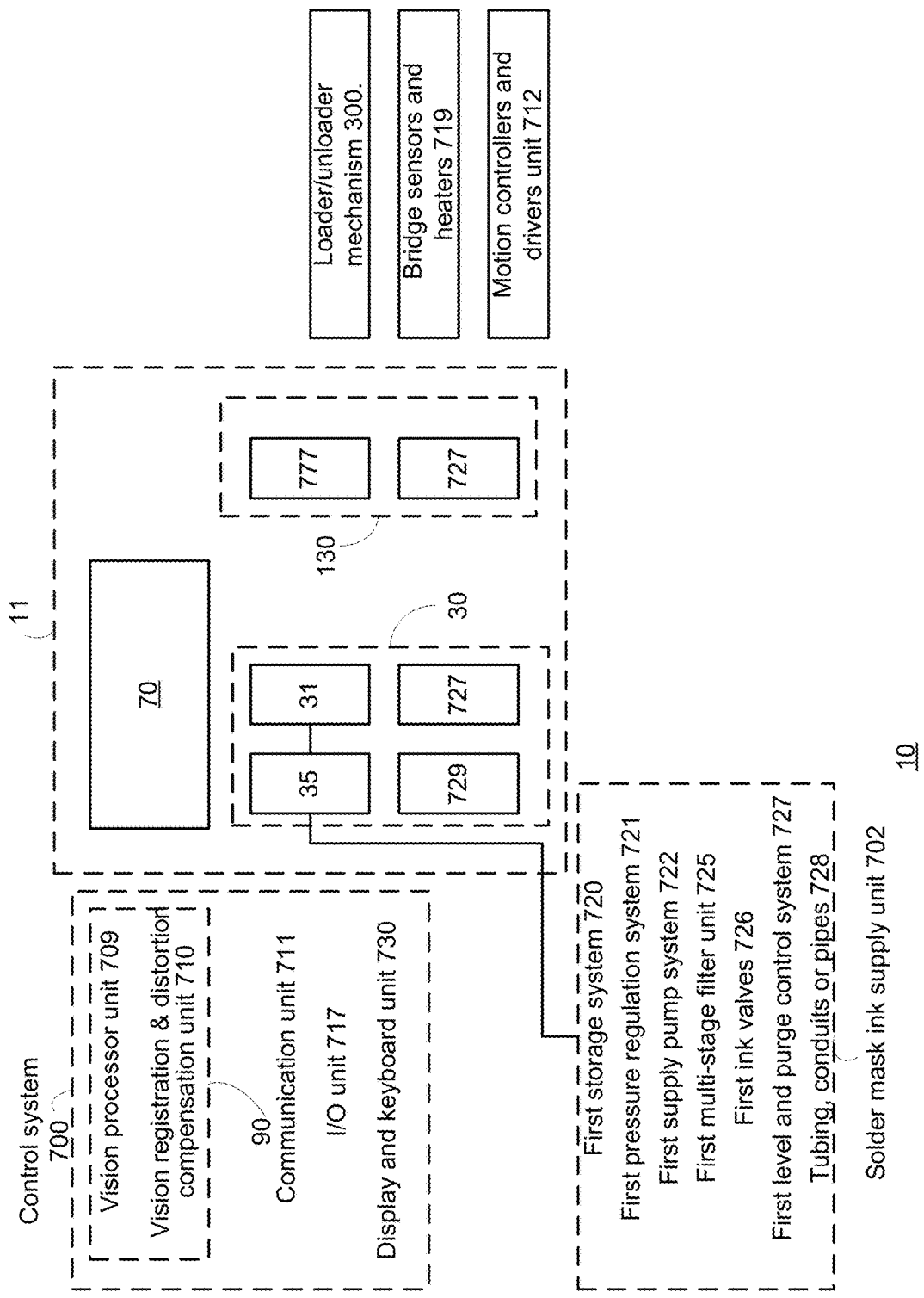

FIG. 5 illustrates system 10 according to another embodiment of the invention.

System 10 include control system 700, motion controllers 712, vision registration and distortion compensation unit 710, PCB handling sub-system 70, bridge sensors and heaters 719, illumination unit 777 (that may belong to inspection unit 130), imaging optics and sensor 778 (that belong to inspection unit 130), curing unit 729, curing control 727 that controls the curing process, jet nozzle drivers 715, jet nozzles 31, and solder mask ink supply unit 702.

It is noted that system 10 may include any first portion out of first portions 200 and 400.

Control system 700 can include one or more controllers, processor, micro-controllers, and the like. It may include a man machine interface for receiving commands, providing status, displaying images of objects and the like.

Control system 700 may be configured to perform at least one of the following operations:

A. Convert solder mask ink pattern information to commands that activate jet nozzles, wherein the solder mask pattern information is indicative of solder mask ink deposition locations that are determined based on the spatial differences, and locations of the model of the PCB that should be coated with the solder mask ink.

B. Perform image processing of images obtained before, during and/or after the printing process.

C. Receive image and status information during the printing process.

D. Manage malfunctions by activating backup jet nozzles, changing the timing of ink jet operations (amend firing times of jet nozzles).

E. Control the movement motors such as motors 40, 50, 140 and 150, object handling sub-system 70, and F. Control a provision of jettable substrates to the jet nozzles 31.

Control system 700 may include one or more card cages to accommodate various electronic cards and provide supply voltages and data paths to and from these cards. It may include an image processing system that may include software modules, hardware modules or a combination thereof. It may convert commonly supported image file formats such as PDL (Page Description Language), postscript or other vector-type of graphic files into a pixel-mapped page image, which is in effect the actual print data that is transferred to the printer to print a pattern, representing the image of the data file. A widely used file format is e.g. the Gerber or extended Gerber format. Converted print data may be provided via a data path and synchronizing board of control system and be transferred to jet print head drivers 705. This converted print data may be provided from the drivers to the multiple jet nozzles, situated on the static and rigid printing bridge 20 (or bridges 20 and 120). The Synchronizing board 704 provides the means of synchronizing the data timing with the vacuum table 708 movement.

Optionally, control system 700 includes a vision system, including a processor 90 that may include vision processor unit 709 and vision registration & distortion compensation unit 710, which is employed for various tasks, in particular for solder mask printing, further below described in more detail.

Optionally, control system 700 includes a communication unit 711 for providing data into motion controller and drivers unit 712, which transforms the electrical positional signals, representative of the positional data, into electric control signals, commonly pulses that operate the object handling sub-system 70, first print jet head motor 40 and second print jet motor 50. Object handling sub-system 70 may include a motor and a vacuum table denoted 708 in FIG. 8.

Optionally, system 700 includes one or more additional motors (not shown) that may change the vertical distance between vacuum table 700 and printing bridge 20. These additional motors may also be controlled by vertical positional control signals from motion controller and drivers unit 712. This vertical movement may assist in compensating for thickness differences between different objects.

I/O unit 717 of control system 700 communicates with the various components of system 10, such as inter alia, bridge sensors & heaters & system heaters 719 and loader/unloader 720.

I/O unit 717 may also communicate with various components of the system such as valves (not shown) that control the vacuum level at different locations of vacuum table. This allows a reduction of the vacuum level in areas that are proximate to jettable substance that was jetted on the object and was not cured. These valves may achieve area addressable suction force in vacuum table 708, as illustrated in U.S. Pat. No. 6,754,551 of Zohar which is incorporated herein by reference. These values form a part of area-addressable suction force valve system 718 that provides different vacuum levels to different parts of vacuum table 708.

The jet nozzles 31 may receive the first jettable substance from solder mask ink supply unit 702.

The solder mask ink supply unit 702 may include: (i) a first storage system 720 that may include one or more containers, including a main container and a secondary container that functions as a level controlling system by applying gravity and physic's principal of communicating vessels, thus controlling the negative meniscus pressure; (ii) a first pressure regulation system 721, utilizing above-mentioned principal of communicating vessels; (iii) a first supply pump system 722, controlled by control system 700, (iv) a first multi-stage filter unit 725, controlling maximum particle size of ink substance, (v) multiple first ink valves 726; (vi) a first level and purge control system 727 with a multitude of level sensing devices; (vii) a first wiping, solvent washing, purging and priming unit (not shown); (viii) a first fluid collection vessel, collecting ink and cleaning fluids (not shown); (ix) a first air bubbles drainage system (not shown); (x) a first temperature control system (not shown), that may include a first heating unit, a first temperature sensing unit and a first temperature control unit, (xi) tubing, conduits or pipes 728 for supplying the first jettable substance to first jet print head 30.

Subsequent initial curing (making the dispensed image substantially tack-free), or optionally, complete curing, is achieved in curing unit 32, wherein accordingly to the utilized ink type, thermal, IR (infra-red) oven or curing by UV (ultra-violet) exposure is applied.

Various operator related interactions with the system are performed utilizing a display and keyboard unit 730 of control system 700.

Figure 7:
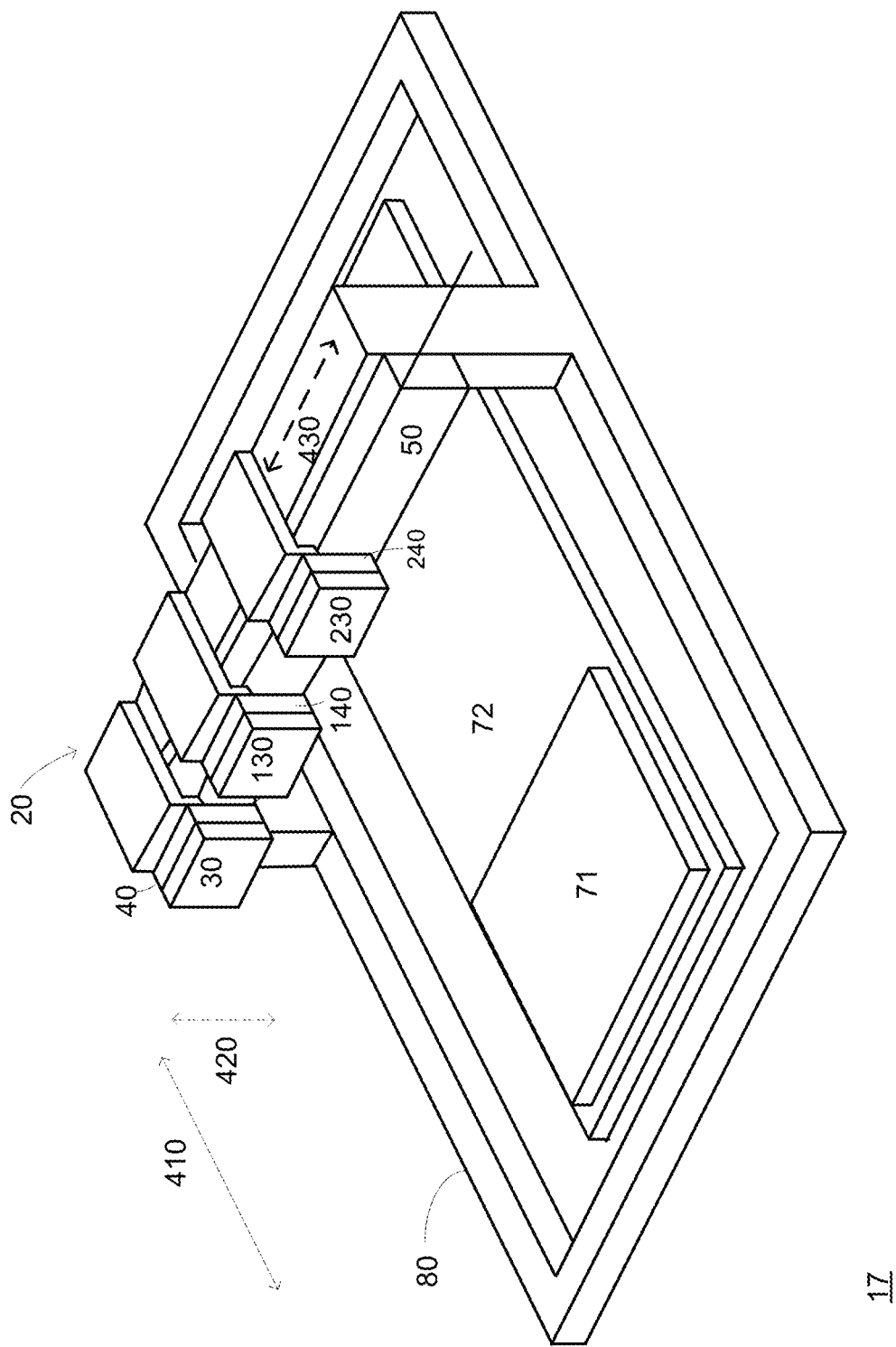

FIG. 7 illustrates a first portion 700 of system 10 according to an embodiment of the invention.

First portion 700 differs from first portion 200 by having a repair unit 230 that is connected to a removal unit motor 240 that introduce z-axis movement in relation to the bridge 20. Repair unit 230 may remove excess solder mask by laser or mechanical means.

According to another embodiment of the invention the repair unit 230 is separated from system 10 and may apply, for example, chemical etching processes on the PCB. Alternatively, the removal process may not be executed while the PCB is supported by the mechanical stage but by a repair unit that belongs to the system. Yet alternatively, multiple repair units may be provided including chemical based removal units, mechanical based removal units and radiation based removal units.

Figure 6:
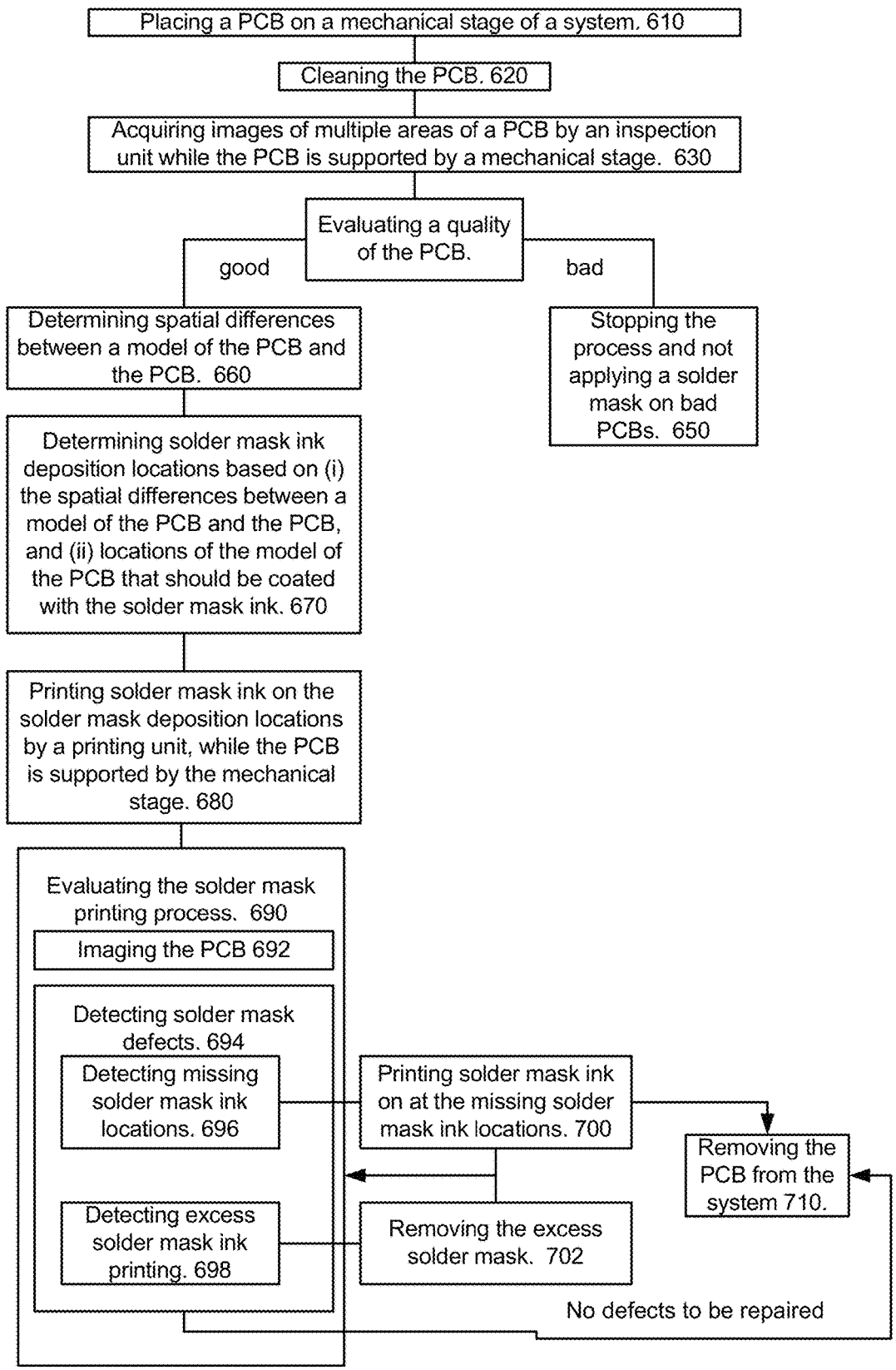

FIG. 6 illustrates a method 600 according to an embodiment of the invention.

Method 600 starts by stage 610 of placing a PCB on a mechanical stage of a system. This stage may be referred to as loading the PCB to the system. The PCB may be included in a panel that includes multiple PCB and in this case the entire panel is loaded to the system and the different PCBs of the panel can be processed by the following stages of method 600.

Stage 610 may include holding the PCB to a vacuum and clamp table or otherwise firmly holding the PCB so that prevent unwanted movements of the PCB during the execution of method 600.

Stage 610 is followed by stage 620 of cleaning the PCB.

Stage 620 is followed by stage 630 of acquiring images of multiple areas of a PCB by an inspection unit while the PCB is supported by a mechanical stage. These areas may overlap, may partially overlap, may be spaced apart from each other, my cover the entire PCB or only one or more portions thereof. Each area can be imaged once or multiple times.

Stage 630 is followed by stage 640 of evaluating a quality of the PCB. The quality of the PCB may reflect whether the PCB is functional ("good") or defective ("bad"). It is noted that more than two classes of PCBs can be provided (as well as more than a pair of corresponding quality levels). For example, some PCBs can be of problematic quality but their defects can be re-worked while the defects of other PCBs cannot be fixed (or are too costly to fix). For simplicity of explanation the following description refers to two classes of PCBs—good one and bad ones.

If, for example, stage 640 is applied to a panel that includes multiple PCB's then the quality of the panel can be calculated in response to the quality levels (defect levels) of these different PCB's. The quality level of the panel can be determined by applying one or more functions that take into account the quality of the different PCBs. For example—if one PCB is defective then the panel can be further processed but this single PCB may not undergo additional processes such as solder mask printing. Yet according to an embodiment of the invention a predefined number of defective PCBs can cause the entire panel to be regarded as a defective one.

Stage 640 may include applying a defect detection algorithm on the images (or some of the images) obtained during stage 630. Stage 640 may include comparing the images of the areas of the PCB to design data of the PCB, comparing the images to a reference PCB (such as a golden reference), and the like.

If the PCB is classified as a bad PCB—stage 640 is followed by stage 650 of stopping the process and not applying a solder mask on bad PCBs. Stage 650 can include repairing the PCB (or panel) or throwing it away.

If the PCB is classified as a good PCB then stage 640 is followed by stage 660 of determining spatial differences between a model of the PCB and the PCB.

Stage 660 may be based, at least in part, on images acquired during stage 630 and, additionally or alternatively, on images that may be obtained during stage 660.

Stage 660 may include performing global alignment and local alignment. Global alignment may include determining the overall deviations of the PCB from the model of the PCB, for example by calculating deviations of targets located near the edges of the PCB from their expected (deviation free) locations. Local alignment may include determining local deviations of portions of the PCB from their expected location. The deviations may results from deformation of the PCB during the manufacturing process and may include rotational deviations, shrink, stretches, and the like.

The spatial differences may be determines by locating alignment targets, measuring deviations in the locations of the alignment targets and calculating the spatial deviations of other portions of the PCB based on the measured deviations. Linear and, additionally or alternatively, non-linear functions may be used to provide the spatial deviation of the various portions of the PCB.

Stage 660 is followed by stage 670 of determining solder mask ink deposition locations based on (i) the spatial differences between a model of the PCB and the PCB, and (ii) locations of the model of the PCB that should be coated with the solder mask ink. The location of the model can form a desired image that includes desired target pixels—desired pixels that should be to be coated with solder mask ink.

The solder mask ink locations are adjusted to fit the PCB that is going to be covered with solder mask ink.

For example, the spatial differences can be represented by shift function ($F(x,y)$) or an array of spatial shift vectors that indicate the evaluated (or measured) shift of different portions of the PCB. This array or function is used to transform the desired target pixels ($Pdesired\_target(x,y)$) to actual target pixels ($Pactual\_target(x,y)$). $Pactual\_target(x,y)=F[Pdesired\_target(x,y)]$. The actual target pixels are also referred to as solder mask deposition locations.

Stage 670 may include adjusting computer aided design data of about the solder mask to compensate for spatial instability of the PCB.

Stage 670 is followed by stage 680 of printing solder mask ink on the solder mask deposition locations by a printing unit, while the PCB is supported by the mechanical stage. Stage 680 may include printing solder mask ink by jet nozzles and curing the solder mask ink by a curing unit. After the curing the solder mask ink can be dry or semi-dry.

Stage 680 is followed by stage 690 of evaluating the solder mask printing process. Stage 690 may includes stage 692 of imaging the PCB and stage 694 of detecting solder mask defects.

Stage 694 may include stage 696 of detecting missing solder mask ink locations—location of the PCB that should have been coated by solder mask ink but are not coated by solder mask ink.

Stage 696 may be followed by stage 700 of printing solder mask ink on at the missing solder mask ink locations. Stage 700 may be followed by stage 690 or be followed by stage 710 of removing the PCB from the system—unloading the PCB from the mechanical stage that supported the PCB during stages 620-690.

Additionally or alternatively, stage 694 may include stage 698 of detecting excess solder mask ink printing—locations that were not supposed to be coated by solder mask ink but were actually coated by solder mask ink. Stage 698 may be followed by stage 702 of removing the excess solder mask. Stage 702 may be followed by stage 690 or be followed by stage 710 of removing the PCB from the system—unloading the PCB from the mechanical stage that supported the PCB during stages 620-690.

Stage 690 may include comparing the solder mask (or solder mask pattern) that was actually printed to the solder mask ink deposition locations determined during stage 670.

Method 600 can be executed by any of the systems illustrated above. For example, stage 630 can include acquiring images of multiple areas of the PCB by an inspection unit while introducing movement between the inspection unit and a bridge that is located above the mechanical stage. The same can be applied during stage 690. Stage 680 may include printing solder mask ink on the solder mask deposition locations by the printing unit while introducing movement between the printing unit and the bridge.

Yet for another example, stage 630 may include acquiring images of multiple areas of the PCB by an inspection unit while introducing movement between the inspection unit and a first bridge that is located above the mechanical stage. The same movement can be introduced during stage 690. Stage 680 may include printing solder mask ink on the solder mask deposition locations by the printing unit while introducing movement between the printing unit a second bridge.

Yet for a further example, stage 630 may include acquiring images of multiple areas of the PCB by an inspection unit while moving the mechanical stage along a first direction and moving the inspection unit along a second direction. Stage 680 can include printing solder mask ink on the solder mask deposition locations while moving the mechanical stage along a first direction and moving the printing unit along a second direction.

There may be provided a system that may include a combination of one or more printing units and one or more inspection units.

The inspection unit can include cameras such as line scan cameras or array cameras. The inspection unit can acquire images using visible light, infra red (IR) sensing, ultraviolet (UV) feedback, electrical testing, magnetic field measurement etc.

The system can perform the printing and inspection during various types of Inkjet material deposition processes (hereafter referred to as "inkjet printing"), some are listed below—only as non-limiting examples.

Electronics—Conductive Trace

Conductive material can be printed on a substrate which may have certain dielectric properties in order to produce an electric circuit. The result may be used as an radio frequency identification (REID) circuit, a solar panel, or a general purpose electronic circuit. The geometry of the printed traces, their conformance to the designed pattern should comply with a predetermined design for the proper operation of the resulting circuit.

Proper deposition of the conductive material may not necessarily be achieved during the printing process. If less than the desired amount is printed, this may result in traces that do not have the expected electrical properties. The traces may be thinner than specified, and may even become disconnected thus disrupting the continuity of the electrical signal.

If more than the desired amount is printed or printed in the wrong position, traces that were designed to be separate may become connected and thus generate a "short circuit" again disrupting the intended path of the electrical signal.

Traces thinner or thicker than designed will have unwanted electrical properties and will potentially distort the electrical signal.

The system can inspect the substrate to find defects that may result in any of the mentioned above errors and may repair such defects, The repair may include removing any unwanted portions and/or properly reprinting the traces.

The integration of inspection and printing may ensure process quality. It may enable modifying printing parameters according to the inspection results and thus immediately correct deviations from the intended performance. It may enable early detection and repair or replacement of printer components that may have failed or are on the verge of failing. It may ensure that both the substrate and printed materials conform to the requirements so that the resulting product will have the intended performance.

Electronics-Solder Mask

PCBs are covered with a coating called "Solder Mask" (SM). SM covers most of the surface of a PCB leaving certain portions uncovered so that components can be soldered on the exposed conducting areas. These areas are called pads. It is essential that the pads are not contaminated by any stray materials (including remainders of SM) so that components can be mechanically and electrically attached successfully. It is also essential that SM provides full protection to all the areas it covers during the manufacturing processes and during the entire lifetime of the finished electrical circuit. As such SM must be placed accurately on the PCB and it must have the proper geometrical qualities and thickness after deposition.

Inkjet may be used to print SM on a PCB. Despite the fact that inkjet printers are capable of very accurate printing, production defects do occur and may have very adverse effects on the finished product.

An unwanted SM drop on a pad may eventually disrupt the proper soldering of a component.

Conductive traces that are not properly covered by SM may become connected to one another during a manufacturing step and create a short circuit which may result in an improper electrical circuit.

In order to avoid such defects the integration of printing and inspecting capabilities (to provide a so-called integrated inspection) may detect these impairments at an early stage of the manufacturing process and enable corrective action whether by removing excess deposits or by adding material where missing.

Integrated inspection may also provide immediate feedback on the performance of the printing unit of the system thereby allowing amending the printing process. Deteriorating components, units can be dealt with, corrective action can be taken. Corrective action can be in the form of machine parameter adjustment, parts maintenance activities, components replacement, materials analysis etc.

Electronics-Etch Resist

In conventional PCB manufacturing a substrate covered on one or both sides with a copper foil is selectively etched removing portions of the copper and leaving traces of copper which eventually make up an electrical circuit. The selective etching is achieved by covering the areas which need to remain on the circuit with a material that acts as "etch resist". Areas that are not covered by the etch resist are removed by the etchant. Inkjet printing is one of the many methods used to deposit etch resist to cover the copper and protect it.

As any other manufacturing process, inkjet printing of etch resist is also prone to defects. Material that lands in areas that should otherwise be uncovered, inadvertently protects the copper underneath and leaves a potentially dangerous conductor where it shouldn't. It may even cause a short circuit.

Missing material may not properly protect the underlying copper which is eventually etched away becoming an open circuit or a trace with improper electrical characteristics.

Integrated inspection may detect these impurities and will allow prompt corrections before irreversible damage is done.

Mechanics-Rapid 3D Prototyping

Inkjet printing is used to deposit layers of polymeric materials according to instructions from computer aided design programs. The result is a 3D prototype of the intended product. The prototype may have moving parts as well as hidden spaces.

The prototype allows testing the design and sometimes can even become the end product by itself.

Any deposition defect during one of the layers soon becomes embedded and undetectable only to be discovered after the entire process is finished. By this time, the entire prototype may become useless.

Integrated inspection enables discovering defects during each of the layers. The defects can then be dealt with immediately—can be repaired. The defective layer may be scrapped and re-deposited or, in a worst case event, the prototyping can be aborted saving time and material.

Like any other production process, digital printing may incur defects that may cause final defects in the manufactured product. Inspection may be performed prior to printing to correct defects before they are covered, during the printing process for process control and/or at the end of the process to ensure a defect-free end product.

Since digital printing is becoming a method of producing products such as solar cells, RFID antennas, Ceramic tiles and other printed electronics products as well, it makes sense to incorporate inspection into the printing systems to perform online inspection in these systems too.

Incorporating the inspection system within the printing system provides additional benefits such as minimizing handling, improving accuracy, and consequently guarantees a superior final product.

In-line inspection has the potential to provide feedback for the printing process, enabling its prompt modification, and allow immediate repair of detected defects using digital printing techniques or other methods on the printing machine.

By adding inspection capabilities and or repairing capabilities to the printing system, the inspection and repairing can be done on the printer, further reducing handling defects, improving production costs due to fewer steps and quick response etc.

In the following paragraphs, some examples are detailed:

Post printing inspection: Inspection of conductors deposited in the manufacturing of PCBs, using a conductive ink. Any undetected failure in the printing will immediately cause a defect such as a short circuit or an open circuit in and between conductor lines. Incorporating inspection system on the printer will provide immediate feedback to the printer enabling it to correct both the reasons that led to the defect as well as to repair the end result. The corrective action may be performed automatically by the tool or by intervention of the tool operator.

Post printing inspection; in the manufacturing of PCBs, etch resist may be printed by and inkjet system. Any failure in the printing will consequently cause a defect such as a short circuit or an open circuit in and between conductor lines. Incorporating inspection system on the printer will provide immediate feedback to the printer enabling it to take corrective action.

Post printing inspection, in the manufacturing of PCB with buried capacitance or resistance layers, malfunctions of print heads may lead to wrong values of capacitance or resistance.

Pre-printing inspection. The printing may be performed on a defected substrate. If so, the costly printing operation is done for nothing. Performing inspection prior to the printing will verify that the substrate has no defects.

Pre-printing inspection. In the manufacturing of PCBs, the legend may be printed using digital printing. Inspection of the PCB prior to the legend printing will verify that the PCB has no defects and that the printing may proceed. This will save unnecessary steps and provide better cost reduction in the production process.

In process inspection. In the manufacturing of 3D prototypes using inkjet printers, malfunction of a print head may lead to a deformed prototype. In this case inspection is effective only during the printing process when done after every printed layer.

In process inspection. In the process of printing patterns on ceramic tiles using inkjet printer, malfunctioning of a print head may lead to a defect in the pattern. Such a defect can be corrected with little cost if detected before final baking of the tile. In this case effective in process feedback can be achieved using inspection on the printing machine. Pre-printing inspection will also give effective feedback about the defects already existing in the tiles, provide feedback to prior processes and avoid printing on a defective tile.

In process inspection. In the process of printing RFID antennas using inkjet printer, there is a critical need of online feedback. Doing inspection online per printing layer will give feedback and immediate correction on the next layer of printing and by that the final product will be always good;

In process inspection. PCB production may be produced by layers of digital printing of conductive and isolation layers. In order to achieve a non-defective product, inspection would be necessary after each of the printing layers, otherwise defects would be impossible to detect.

A printing system may include an inspection system either on the printing head or on a different head/bridge.

The printing can include printing of various inks for various purposes such as Etch resist printing; solder mask printing, legend printing, conductive ink printing, capacitance and resistance layers printing, 3D parts printing and the like.

According to an embodiment of the invention a method may be provided. The method may include printing on a substrate supported by a mechanical setup, acquiring an image using illumination and image acquisition units, analyzing the image using automated or manual means, comparing the image to a reference one, determining discrepancies between the reference and acquired images, determining the severity of the discrepancies, suggesting actions to correct the discrepancies, taking actions to correct the discrepancies suggesting actions to avoid the recurrence of the discrepancies, taking actions to avoid the recurrence of the discrepancies.

The method may include inspection of the substrate prior to printing to determine whether it is worthy of printing.

The method may include inspection during the printing action to possibly modify the printing conditions or to abort the printing to avoid the generation of discrepancies.

The method may include moving the substrate relative to the printing unit. The method may include moving the printing unit relative to the substrate. The method may include moving the substrate relative to the inspection unit. The method may include moving the inspection unit relative to the substrate.

The method may include moving the substrate to take corrective actions.

The method may include modifying printing conditions, parameters and other elements to correct discrepancies in the current printing step. The method may include modifying printing conditions, parameters and other elements to prevent occurrence of discrepancies in the future.

The method may include manual or automatic cleaning operations to remove potential hazards that may generate discrepancies during the printing operation.

The method may include manual or automatic adjustment, possible removal and possible replacement of elements that actually create or may create in the future discrepancies between the reference image and the final printing result.

A system may be provided to include units to implement the aforementioned methods.

The system may include mechanical unit to hold the substrate, the printing units, the print support units, the inspection units, the inspection support units, various control, decision making, and computing units.

The system may include hydraulic, pneumatic, electrical and electronic units to enable proper operation of any units comprising the system.

The system may include motion units, motors, motion stages, motion control systems to move the substrate and the printing units relative to each other, to move the substrate and the inspection units relative to each other, to move the inspection units and printing units relative to each other.

The system may include units to take corrective actions such as but not limited to cleaning the substrate prior to printing, removing unwanted portions of the printed image, cleaning parts of the system involved in the generation of unwanted results.

The system may include elements such as but not limited to motors, adjustment screws, levers to calibrate, adjust, reposition or perform other corrective actions on the printing units and subunits, inspection units, and subunits, motion units and subunits, substrate holding units and subunits.

Figure 8:
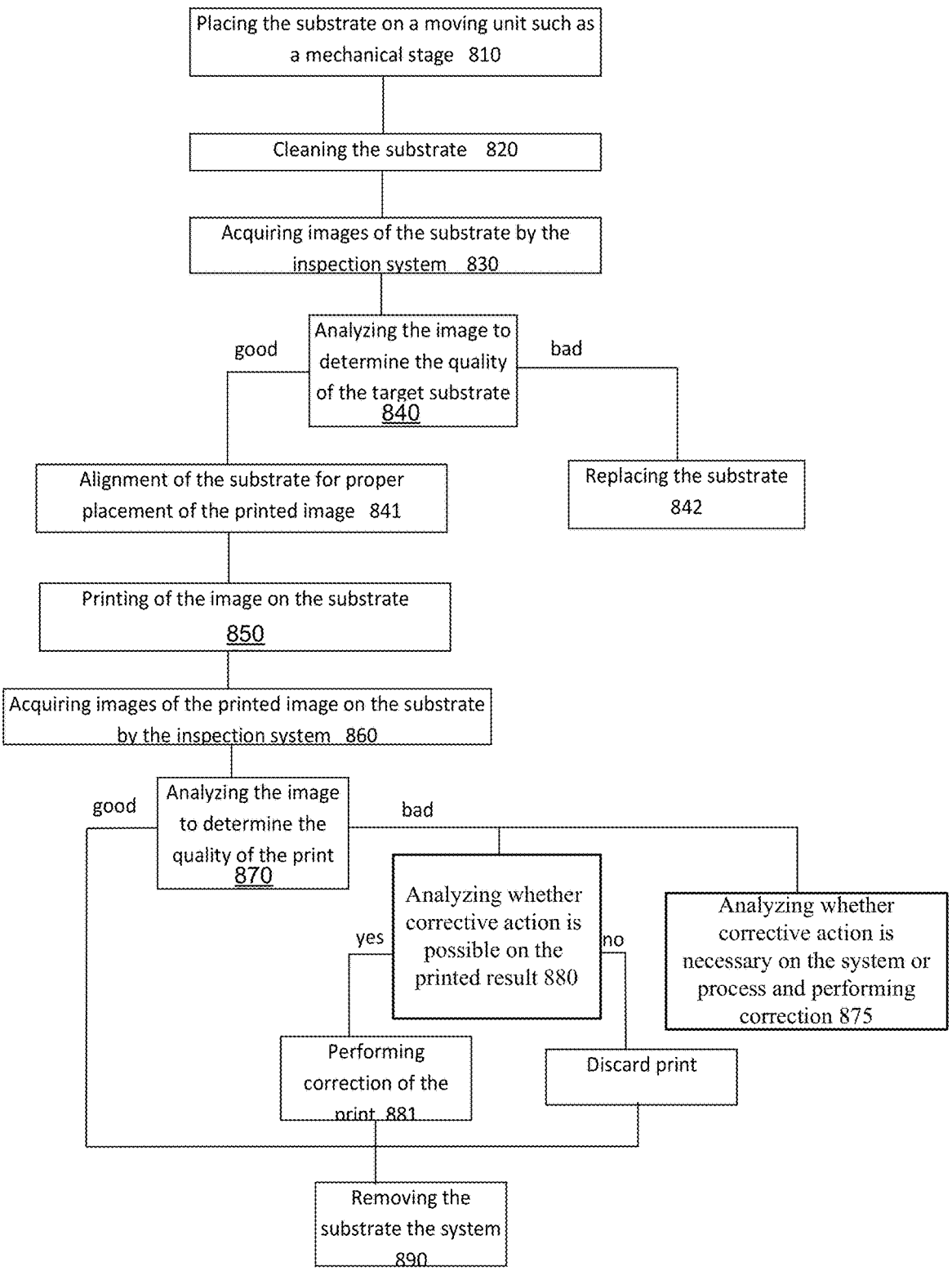

FIG. 8 illustrates a method 800 according to an embodiment of the invention.

The first stage of method 800 is 810 whereby the substrate on which the printing is to be performed is placed on a mechanical stage of a system. Based on the specific application the substrate can be but not limited to a PCB substrate prior to conductive ink printing, a PCB substrate covered by copper foil prior to etch resist printing, a finished PCB prior to solder mask printing, a PCB covered by solder mask prior to legend printing, a base for 3D prototype, a ceramic tile prior to printing.

During the next stage (820) the substrate is cleaned or prepared for receiving the print.

Next, the substrate is inspected to verify its quality and eligibility for printing.

Stage 830 specifies acquiring an image of the substrate by the inspection system in preparation for analysis in stage 840.

If the analysis in stage 840 yields a bad result, the substrate can be replaced (stage 842).

If the substrate is found to be good then in stage 848 an alignment operation is performed to align the printed image to the substrate. The alignment operation may use the elements that comprise the image acquisition and analysis portion of the inspection system.

Printing is initiated and occurs in stage 850.

During stages 860 to 880 which can occur at the end of the complete printing cycle or concurrently with the printing stage 850 the current or final printing result is inspected for discrepancies between the intended printing result and the actual printing result. The discrepancies are discovered by using relevant image acquisition techniques such as but not limited to appropriate illumination sources, illumination angles, optical filters as well as relevant image analysis techniques such as but not limited to pixel comparison, feature comparison, tolerance measurements, artificial intelligence, statistical algorithms etc.

If the inspection outcome is negative indicating an unwanted printing result, then a number of actions can be initiated.

If in stage 880 it is determined that the unwanted printing can be corrected, then corrective actions may be performed and the printing can be resumed.

Corrective actions of stage 888 may include but are not limited to reprinting areas where print is missing or has insufficient thickness, selectively removing ink and cleaning contaminated areas, marking unusable subsections etc.

If it is determined in stage 880 that corrective actions are not possible, then the printed substrate is discarded (stage 882).

Based on the result of stage 875, it can be determined that portions of the printing process or the machine may require corrective actions. Such corrective actions may include but are not limited to adjusting or calibrating portions of the system or units, cleaning portions of the system or units, replacing portions of the system or units, adjusting and calibrating process parameters, adjusting printing job definitions etc.

Stage 875 may occur concurrently with stages 880 to 890.

At the end of the process, at stage 890, the resulting substrate is removed from the system.

Figure 9:
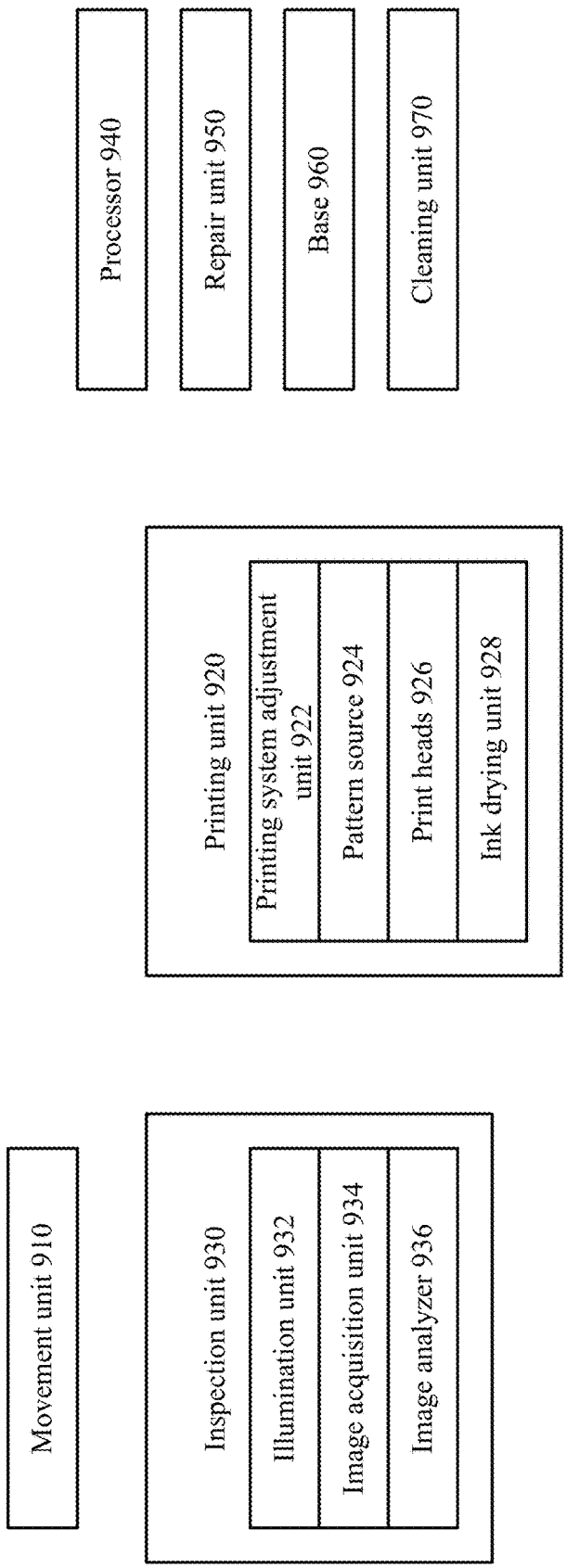

FIG. 9 illustrates a system 900 according to an embodiment of the invention.

The system 900 may include a movement unit 910, a printing unit 920, an inspection unit 930, a processor 940, a repair unit 950 and a frame such as base 960.

Referring to FIGS. 5 and 7, printing unit 920 can be the same as printing unit 30, inspection unit 930 can be the same as inspection unit 130, repair unit 950 can be the same as repair unit 230, base 960 may include frame 80, control system 700 can include processor 940—but this is not necessarily so and other configurations of system 900 can be provided.

The printing unit 920 may be arranged to print a pattern on an area of a substrate, during a printing process.

The inspection unit 930 may be arranged to inspect the area of the substrate to provide inspection results.

The processor 940 may be arranged to search for a defect, based upon the inspection results; and to determine, if a defect is found whether to (a) repair the substrate, (b) perform a corrective measure for improving the printing process, or (c) perform no corrective measure in response to the defect.

The repair unit 950 may be arranged to respond to the determining by repairing the substrate if it is determined to repair the substrate.

The printing unit 920 may include a printing system adjustment unit 922 that is arranged to perform the corrective measure if it is determined to perform the corrective measure, a source 924 of the pattern to be printed can be the result of various prior processes such as but not limited to scanning, computer generation, computer aided design (CAD) output etc, print heads 926 that may receive the image, synchronization signals from the printing mechanisms and system, ink supply, pneumatic feeds, and any other means required for the actual printing process, and an ink drying unit 928 that may be arranged to dry the printed ink after the ink is deposited, thereby fixing the ink to the substrate, drying the ink, curing the ink or be prepared for further handling by the ink drying unit 928 which may include but is not limited to radiation of varying wavelengths, heat, air current etc.

The pattern can be represented by an image. The image may be stored locally on the machine or remotely in a server computer. The image may be further prepared for printing and transferred to the printing mechanism using any suitable means such as but not limited to computer software raster image processing, electronic raster image processing, computer software vector image processing, electronic raster image processing, wireless communication means, direct electronic link, optical link etc.

The printing system adjustment unit 932 may be arranged to modify at least one printing parameter.

The system 900 may be arranged to perform the inspection and determine whether to apply the corrective measure before a completion of the printing process.

The system 900 may be arranged to stop the printing process before the completion of the printing process if it determined that a defect is non-repairable.

The inspection unit 930 may be arranged to perform an initial inspection of the area of the substrate before initiating the printing process; wherein the processor is arranged to determine, based upon results of the initial inspection whether to initiate the printing process.

The inspection unit 930 may include:
a. An illumination unit 932 that may be arranged to illuminate the substrate, prior to printing process, during the printing process, and additionally or alternatively, after the printing is completed, the illumination unit 932 may include a radiation source such as incandescent lamps, light emitting diodes, laser of varying wavelengths. The substrate may be illuminated from varying angles separately or concurrently as required by the object's characteristics.
b. Image acquisition unit 934 that may acquire one or more images of the substrate (or of an area of the substrate). The image acquisition unit 934 may include digital cameras, analog cameras, color or monochromatic sensors, devices sensitive to the wavelength generated by the illumination unit or by the illuminated object being inspected etc.
c. Image analyzer 936 (if the processor 940 does not perform this analysis) that may analyze any image acquired by the image acquisition uni. The image analysis unit 936 may include image grabbers, electronic image analyzers, computer software, image processing and understanding algorithms, artificial intelligence, etc. The results of the analysis can be used to assess the success of the printing operation, whether corrections or repair are required whether the printed object has the required quality, whether it should be scrapped, whether the system needs maintenance, whether the process requires modifications etc The processor 940 may be arranged to determine a severity of the defect. At least some of the functionalities of the processor 940 can be included in the inspection unit.

The movement unit 910 may be arranged to introduce a relative movement between the substrate and at least one unit selected out of the printing unit, the inspection unit and the repair unit.

The system 900 may include a cleaning unit 970 that may be arranged to clean the substrate before initiating the printing process, to remove potential foreign elements that may contribute to a generation of the defect.

The system 900 may include more multiple units out of each of the mentioned above units. Units may be the same or may differ by their functionality.

The movement unit 910 may be arranged to support and move the substrate. It is noted that the substrate can be located at a fixed position while the printing unit 920 and/or the inspection unit 930 can be moved.

The base 960 may enclose zero or more units such as but not limited to computing units, material management units, mechanical motion units, hydraulic motion units, pneumatic units, electrical units, communications units etc.

The arrangement of the units of FIG. 9 is for illustration purposes and may take various forms in real life implementations.

The various units may move independently in independent directions or may be static, they may take more or less space in actual physical implementations, may be placed in other configurations as described in any of the previous figures.

Figure 10:
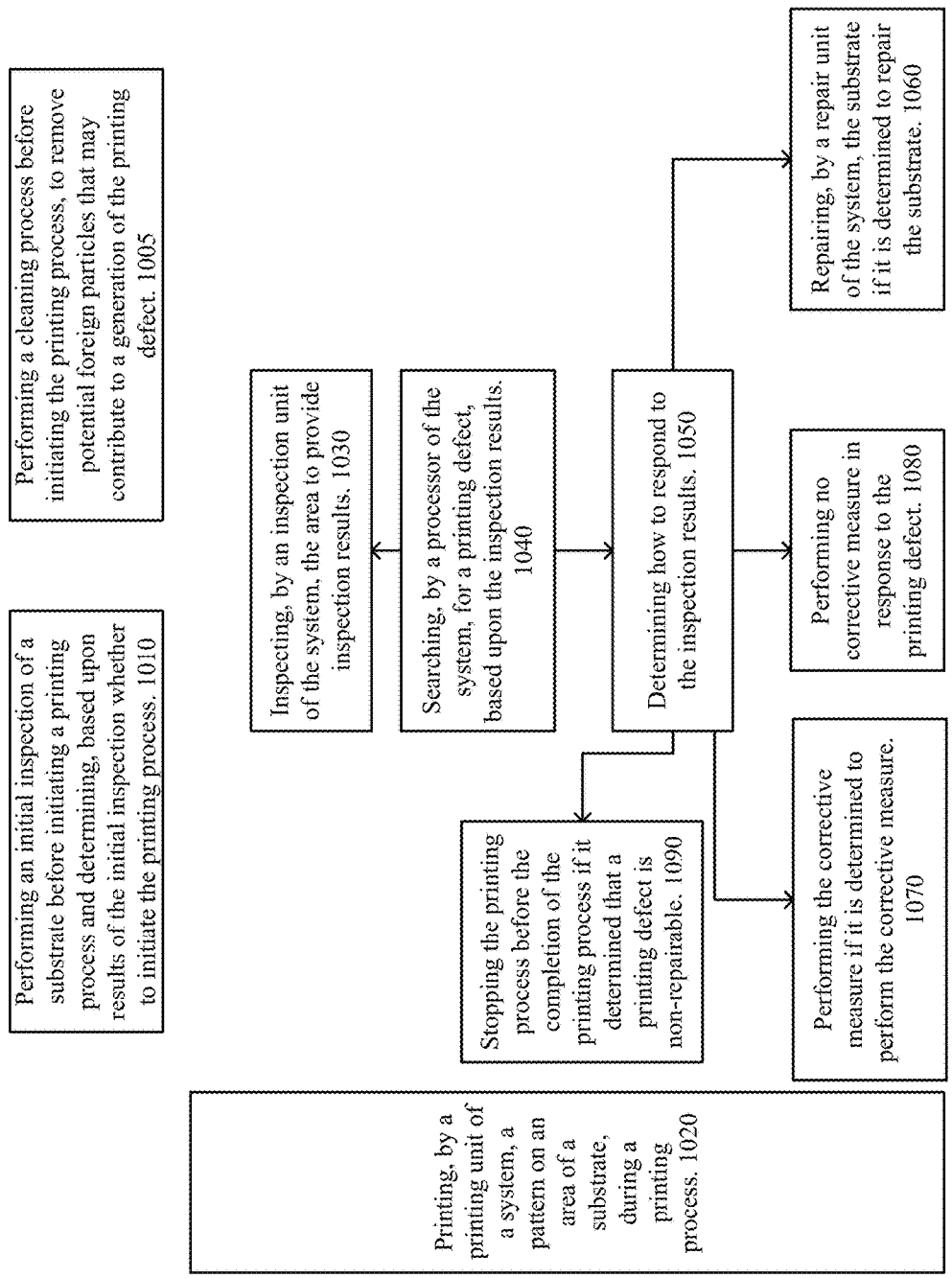

FIG. 10 illustrates method 1000 according to an embodiment of the invention.

Method 1000 for inspection aided printing, may start by stage 1010 of performing an initial inspection of a substrate before initiating a printing process and determining, based upon results of the initial inspection whether to initiate the printing process. If it is determined not to continue (for example—the substrate is defected and is not suitable for printing) then the method ends although in this case the method can continue to a stage of repairing the substrate. Assuming that the printing process should initiate then (As illustrated in FIG. 10), stage 1010 may be followed by stage 1020.

Stage 1020 includes printing, by a printing unit of a system, a pattern on an area of a substrate, during a printing process.

Method 1000 may also include various stages (1030, 1040 and 1050) that may be executed during stage 1020, after the inspection process is completer or both during and after the printing process.

Stage 1030 includes inspecting, by an inspection unit of the system, the area to provide inspection results.

Stage 1030 is followed by stage 1040 of searching, by a processor of the system, for a defect, based upon the inspection results.

Stage 1040 may be followed by stage 1050 of determining how to respond to the inspection results.

Stage 1050 may include determining (if a defect is found) whether to (a) repair the substrate, (b) perform a corrective measure for improving the printing process, or (c) perform no corrective measure in response to the defect.

Stage 1050 may be followed by one or more stages of responding according to the determination. Possible responses are illustrates by stages 1060-1090.

Stage 1060 may include repairing, by a repair unit of the system, the substrate if it is determined to repair the substrate. Stage 1060 may include stopping the printing process or allowing it to be completed.

Stage 1070 may include performing the corrective measure if it is determined to perform the corrective measure. Stage 1070 may include stopping the printing process or allowing it to be completed.

Stage 1080 may include performing no corrective measure in response to the defect.

Stage 1090 may include stopping the printing process before the completion of the printing process if it determined that a defect is non-repairable.

Stage 1050 may be responsive to a severability of the defect.

Stage 1070 may include repairing the printing unit or modifying at least one printing parameter.

The quality of the print result depends on various factors. Among others, these are the mechanics, electronics, optics, fluid dynamics of the printing system, the software, firmware and hardware algorithms used to modify the data sent to the printheads.

The printing is affected by an alignment process which involves the quality of image acquisition. Image quality depends among others, on the calibration of the lens, the camera, the illumination subsystems. The mechanical alignment of the several motion stages (in the X, Y and Z directions), the camera orientation and the printhead positions relative to each other play an important role in the quality of the printing result.

The performance of the printheads depends on the electrical signals supplied to them. These are calibrated to optimize the printhead performance. These signals also depend on the characteristics of the fluid deposited by the printhead.

The printheads comprise a large number of closely and very accurately placed print nozzles through which the fluid is ejected and deposited on the substrate. The quality of the print depends on the performance of the nozzles and the trajectory of the ejected fluid as it is deposited on the substrate.

Algorithms implemented in software, firmware and hardware prepare the signals supplied to the printheads in order to achieve high quality deposition of the fluid on the substrate. The algorithms are influenced by almost all of the factors mentioned above as well as the characteristics of the substrate.

Printing discrepancies discovered during the inspection process are analyzed and may be attributed to one or more of the factors mentioned above. Depending on the nature and severity of the discrepancy, corrective measures can be taken. For example:

a. Missing coverage due to a nozzle that did not eject fluid may be overcome by reprinting the same area with a different set of nozzles and printheads without aborting the printing process.

b. Nozzles that ejected fluid at unexpected position may be disabled, the substrate cleaned and the printing algorithms modified to compensate for the disabled nozzles.

c. Printheads may be replaced if found to be overly malfunctioning.

d. Calibration of the various motion units and stages may be initiated to improve alignment and printing accuracy.

e. Parameters fed to the printing algorithms may be modified to better suit the substrate and fluid.

f. Parameters fed to the electrical systems that operate the printheads may be modified in response to the behavior of the fluid on the substrate g. Parameters fed to the printing algorithms may be modified to better suit the substrate and fluid: Among others, these parameters may be image processing parameters such as the amount of erosion or dilution to be applied to the original image in order to change the size and shape of the printed image to better position the fluid relative to the substrate. The parameters may also be image warping values supplied to the algorithms in order to compensate for expected fluid flow on the substrate.

h. Parameters fed to the electrical systems that operate the printheads may be modified in response to the behavior of the fluid on the substrate. Printheads receive electrical signals that eventually cause the ejection of fluid drops. The amplitude of these signals, their shape, the timing of their activation relative to the motion of the substrate and between different heads, the sequence of the signals driving individual nozzles and heads are some of the parameters that eventually affect the behavior of the fluid on the substrate.

The timing and amplitude of signals sent to the drying mechanisms also determine the behavior of the fluid on the substrate until it stops flowing, thereby changing the end result.

Any of the mentioned above stages can include introducing a relative movement between the substrate and at least one unit selected out of the printing unit, the inspection unit and the repair unit.

Method 1000 may also include stage 1005 of performing a cleaning process before initiating the printing process, to remove potential foreign particles that may contribute to a generation of the defect.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for inspection aided printing, the method comprises:
    for each printed circuit board of a panel that comprises multiple printed circuit boards executing the steps of:
    printing, by a printing unit of a system, a pattern on an area of a substrate of the printed circuit board, during a printing process;
    inspecting, by an inspection unit of the system, the area to provide an image of the area of the substrate;
    evaluating a quality level of the printed circuit board;
    analyzing, by a processor of the system, the image of the area of the substrate to find a defect; wherein if a defect is found—determining whether to (a) repair the substrate, (b) perform a corrective measure for improving the printing process, or (c) perform no corrective measure in response to the defect; and
    calculating, by the system, a quality of the panel in response to quality levels of the multiple printed circuit board.

2. The method according to claim 1, comprising performing the corrective measure if it is determined to perform the corrective measure.

3. The method according to claim 1, comprising executing the inspecting, analyzing and determining before a completion of the printing process; wherein the determining comprises evaluating a reparability of the defect and determining to stop the printing process before the completion of the printing process if it determined that a defect is non-repairable.

4. The method according to claim 1, further comprising performing an initial inspection of the substrate before initiating the printing process and determining, based upon results of the initial inspection whether to initiate the printing process.

5. The method according to claim 1, comprising performing the inspecting after a completion of the printing process.

6. The method according to claim 1 wherein the determining is responsive to a severity of the defect.

7. The method according to claim 1, wherein the performing of the corrective measure comprises modifying at least one printing parameter.

8. The method according to claim 1, comprising introducing a relative movement between the substrate and at least one unit selected out of the printing unit, the inspection unit and the repair unit.

9. The method according to claim 1, wherein the corrective measure comprises repairing the printing unit.

10. The method according to claim 1, comprising performing a cleaning process before initiating the printing process, to remove potential foreign elements that may contribute to a generation of the defect.

11. The method according to claim 1 comprising assisting in a performing of the corrective measure, wherein the corrective measure is for preventing the re-occurrence of the defect during future printing operations—if it is determined to perform the corrective measure.

12. The method according to claim 1 further comprising responding to the determining by repairing, by a repair unit of the system, the substrate if it is determined to repair the substrate.

13. The method according to claim 1, comprising defining the panel as defective when a predefined number of printed circuit board are defined as defective.

14. The method according to claim 1, comprising acquiring images of multiple areas of each printed circuit board by an inspection unit of the system while introducing movement between the inspection unit and a bridge that is located above a mechanical stage of the system; and printing solder mask ink on solder mask deposition locations by a printing unit of the system while introducing movement between the printing unit and the bridge.

* * * * *